United States Patent
Rana et al.

(10) Patent No.: US 10,337,927 B1
(45) Date of Patent: Jul. 2, 2019

(54) GERMANIUM TIN OXIDE THIN FILMS FOR UNCOOLED INFRARED DETECTORS

(71) Applicants: Mukti Rana, Dover, DE (US); Jaime Damiany Cardona, Dover, DE (US)

(72) Inventors: Mukti Rana, Dover, DE (US); Jaime Damiany Cardona, Dover, DE (US)

( * ) Notice: Subject to any disclaimer, the term of this patent is extended or adjusted under 35 U.S.C. 154(b) by 0 days.

(21) Appl. No.: 16/127,589

(22) Filed: Sep. 11, 2018

(51) Int. Cl.
  *G01J 5/08* (2006.01)
  *H01L 21/02* (2006.01)
  *G01J 5/24* (2006.01)

(52) U.S. Cl.
  CPC .............. *G01J 5/0853* (2013.01); *G01J 5/24* (2013.01); *H01L 21/02535* (2013.01)

(58) Field of Classification Search
  CPC ...... G01J 5/0853; G01J 5/24; H01L 21/02535
  See application file for complete search history.

(56) References Cited

U.S. PATENT DOCUMENTS

| 10,236,177 B1 * | 3/2019 | Kohen | H01L 21/02535 |
| 2003/0168599 A1 * | 9/2003 | Liddiard | G01J 5/20 |
| | | | 250/338.1 |
| 2010/0047503 A1 * | 2/2010 | Sakai | G11B 7/2433 |
| | | | 428/64.4 |

OTHER PUBLICATIONS

Lei Xu et al. (Journal of the Electrochemical Society, doi: 10.1149/2.0221802jes, J. Electrochemical. Soc. 2017 vol. 164, issue 14, D1066-D1072).*

* cited by examiner

*Primary Examiner* — Hugh Maupin

(57) ABSTRACT

Microbolometer is a class of infrared detector whose resistance changes when the temperature changes. In this work, we deposited and characterized Germanium Oxide thin films mixed with Sn (Ge—Sn—O) for uncooled infrared detection. Ge—Sn—O were deposited by co-sputtering of Sn and Ge targets in the Ar+O environment using a radio frequency sputtering system. Optical characterization shows that the absorption in Ge—Sn—O was most sensitive in the wavelength ranges between 1.0-3.0 µm. The transmission data was further used to determine the optical energy band gap (0.678 eV) of the thin-film using Tauc's equation. We also found the variations of absorption coefficient ($1.4802 \times 10^5$ m$^{-1}$-$1.0097 \times 10^7$ m$^{-1}$), refractive index (1.242-1.350), and the extinction coefficient (0.3255-8.010) for the wavelength ranges between 1.0-3.0 µm. The thin film's resistivity measured by the four point probe was found to be 4.55 Ω-cm and TCR was in the range of −2.56-−2.25 (%/K) in the temperature range 292-312K. In light of these results it can be shown that this thin film is in keeping with the current standards while also being more cost and time effective.

19 Claims, 8 Drawing Sheets

GERMANIUM TIN OXIDE THIN FILMS FOR UNCOOLED INFRARED DETECTORS

1. TECHNICAL FIELD OR FIELD OF INVENTION

Figure 1:
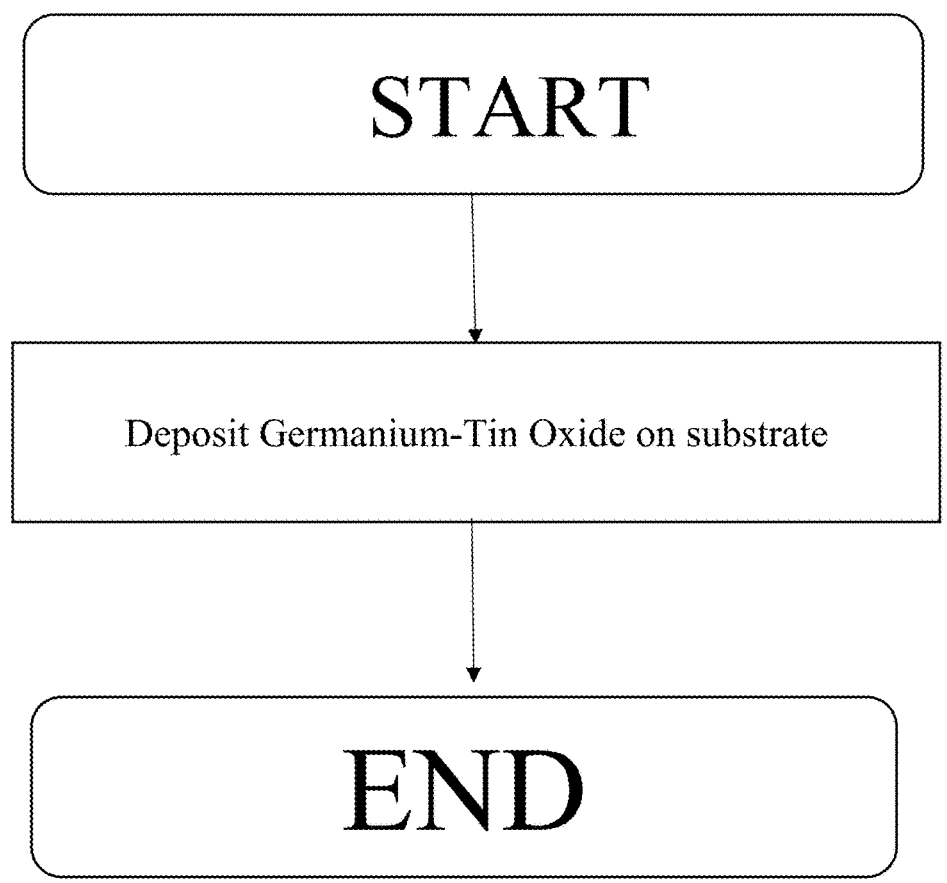

This invention relates to the Germanium Tin Oxide (Ge—Sn—O) thin films for a microbolometer and a method of manufacturing thereof and an infrared detector or microbolometer using Ge—Sn—O. It reports the deposition, characterization and properties of Ge—Sn—O thin films for their electrical, optical, mechanical and morphological properties for microbolometer's sensing layer. Microbolometers are the infrared sensors which change their resistances when the temperature changes. The microbolometer operates in Midwave Infrared (MWIR, 3 to 5 μm) and Longwave Infrared (LWIR, 8 to 14 μm) wavelengths for detecting infrared (IR) radiation. The unique properties of Ge—Sn—O will be used for uncooled IR detection.

2. BACKGROUND OF THE INVENTION

Thermal IR detectors are heated by the incident IR radiation and provide detection through the change in a measurable parameter. For these types of detectors, wavelengths of interest are mainly in the atmospheric windows—ranging from 3 to 5 (MWIR) and 8 to 14 (LWIR) μm wavelength ranges, due to the high transmission through atmospheric air of more than 80% and peak IR emission of room temperature bodies is at 9-10 μm of wavelengths. Thermal detectors like microbolometers are being used contact-less temperature measurement, night vision cameras for defense, security and surveillance applications, search and rescue and many other thermal imaging applications because of their low-cost, better performance and compact size. A main factor in dictating how well a thermal detector will work is the detector's responsivity. Responsivity is the ability of the device to convert the incoming radiation into an electrical signal. Detector material properties influence this value; therefore, several main material properties are investigated which include temperature coefficient of resistance (TCR), optical bandgap, tansmittance, reflectance and absorptance and resistivity in the wavelengths of interest. Other properties such as compatibility with complementary metal oxide semiconductor (CMOS) processing technology, low cost and reliability and stability of the material while exposed to infrared radiation are important.

The microbolometer's sensing materials are classified in two main categories—metals and semiconductors. Metals such as Ti, Ni or Ni—Fe alloys had been reported as bolometer's sensing layers.

Amorphous Si (a-Si) and Vanadium Oxide ($VO_x$) are two of the most widely used materials for sensing layers of microbolometers These two materials suffer from low TCR and low absorption which yields lower figures of merits such as responsivity, detectivity, and noise equivalent temperature difference. By using various atomic compositions of Germanium, Tin, and Oxide in Ge—Sn—O thin films, this invention reports using Ge—Sn—O thin films for microbolometer's sensing layer.

For microbolometers made of semiconducting sensing layers (semiconducting microbolometers), thermal change on a material with a high TCR causes a change in electrical resistance, thus allowing a measurable parameter across the detector with heating and cooling. Once the microbolometer's sensing layer temperature changes, there are three possible mechanisms of heat loss. First, heat is lost through conduction/convection through the atmosphere surrounding the detector thermometer, that is described below. This is minimized by vacuum packaging the detectors. Today, it has been a common practice to include the wafer-level vacuum packaging scheme for all commercially available microbolometers. Second, heat is lost through radiation. The selection of materials will impact this mechanism. However, the materials that are preferred for low heat loss also absorb less infrared radiation, which is not desirable. This mechanism represents the ultimate limit on the performance of the detector. Third, the heat is lost through thermal conduction through the supporting structure of the thermometer. The design of the supporting structure will minimize the thermal conductance of the structure.

The performance of an IR detector for imaging is most commonly described by a parameter called noise-equivalent temperature difference (NETD), which is the measurement of how well a thermal detector will distinguish between slight differences in thermal radiation in the image. The best cryogenically cooled quantum devices will have NETD values below 20 mK. Although no thermal uncooled detector has reached such low values, the theoretical limits of thermal IR detectors operating at ambient temperature are close to the values of cooled quantum detectors for wavelengths above 8 μm. Since thermal noise power increases as the square root of heat conduction, the heat conduction to the environment poses the largest limit in terms of detection. To lower this limit, the thermal bridges between detector to substrate and housing must be minimized. Also, lowering the heat capacity of the detector element by reducing the thickness of the detector structure leads to a large temperature change per radiation input, further reducing the effect of noise. Commercial microbolometers with a lens of an f-number equal to 1 has an NETD value of 35 mK. Micromachining has allowed further improvement of thermal detectors, with the most advanced IR Focal Plane Array (FPA) currently based on microbolometers of vanadium oxide and amorphous silicon, achieving NETD between 25 and 50 mK.

For a thermal detector, the sensitive element is referred to as the thermometer. The thermometer is typically thermally isolated from the substrate to improve the responsivity by suspending it above the substrate using micromachining techniques. The performance of a thermal detector depends upon the thermal capacity $C_{th}$, the rate at which thermal energy is lost through the thermal conductance of the structure, $G_{th}$, and the radiative thermal conductance, $G_{rad}$. The radiative thermal conductance for a gray body, assuming the emissivity is equal to the absorptivity, is given by equation $G_{rad}=4\eta\sigma AT^3$; where η is the average absorption of the detector, a is the Stefan-Boltzmann constant, A is the surface area and T is the absolute temperature. The conductive/convective loss is neglected since the detector is typically operated in vacuum. The temperature change due to a sinusoidally modulated photon flux is given by:

$$\Delta T = \frac{\eta\Phi}{G_{\mathit{eff}}(1+\omega^2\tau_{th}^2)^{1/2}} \quad (1)$$

Where, Φ is the radiant energy flux, is the angular modulation frequency of the incident radiation, and is the thermal time constant ($C_{th}/G_{th}$). The effective thermal conductance, $G_{\mathit{eff}}$, is obtained through a heat balance and is given by:

$$G_{\mathit{eff}}=G_{th}+G_{rad}\pm\alpha P_{bias} \quad (2)$$

Where, α is the TCR of the thermometer, $P_{bias}$ is the power dissipated in the bias of the detector. The sign of the power bias term depends upon the type of bias. The "+" sign corresponds to the voltage bias case while the "−" sign corresponds to the current bias case. For the case of a semiconductive microbolometer, the TCR is negative, which means that the power dissipated in the detector effectively increases the effective thermal conductance $G_{eff}$.

There are other figures of merits than NETD for microbolometers which are described below:

Temperature Coefficient of Resistance (TCR):

TCR exhibits how rapidly the resistance of the sensing material responds to a change in temperature and is expressed as $$\alpha = \frac{1}{R} \cdot \frac{dR}{dT} = \frac{1}{R}\frac{\Delta R}{\Delta T} = -\frac{E_a}{kT^2} \quad (3)$$

Here, $E_a$ is the activation energy and k is the Boltzmann constant. TCR is a material property, so the higher the value, the better it is for IR uncooled detection.

Responsivity: Responsivity is a measure of the dependence of the signal output of a detector upon the input radiant power. The detector output signal may be current or voltage. Thus the voltage responsivity, $R_v$, is defined as the detector output voltage per unit of detector input power.

$$R_v = \frac{\eta \alpha R I_b}{G_{th}(1+\omega^2\tau^2)^{1/2}} \quad (4)$$

Where, η, $I_b$, $G_{th}$, ω, and τ are the absorption coefficient, bias current, thermal conductance, angular frequency, and time constant of the device, respectively. The first three terms of the numerator in the right-hand side of equation (4) (η, α and R) depend on material properties of the microbolometer. Voltage responsivity is expressed in V/W while current responsivity is expressed in A/W. The voltage responsivity of the bolometer is increased by decreasing the thermal conductance of the structure. The thermal time constant of the microbolometer is in the millisecond range as it involves the thermal mass of the sensing layer which needs to heat up for change in resistance because of IR radiation.

Detectivity:

Detectivity, D*, is the area normalized signal to noise ratio. It has the unit of $cmHz^{1/2}/W$. The detectivity is expressed by $$D^* = \frac{R_v \sqrt{A_d \Delta f}}{\Delta v_n} \quad (5)$$

where, $\Delta v_n$ is the total noise voltage observed in the electrical bandwidth Δf and is the sum of noises from the sensing element of the microbolometer—Johnson noise, random telegraph switching noise, 1/f-noise, generation and recombination noise. Higher responsivity represents higher detectivity.

Table 1 shows the list of materials used as the sensing layer of microbolometer infrared detector. The main drawback found in all the materials is the low TCR which also ends up in lower responsivity and detectivity when they are used in microbolomter.

TABLE I

TCR and other figures of merit of bolometer sensing materials.

| Material | TCR (%/K) | Detectivity ($cmHz^{1/2}/W$) | Responsivity (V/W) | Resistivity (Ω-cm) | Pixel size ($\mu m^2$) |
|---|---|---|---|---|---|
| $V_2O_5$ | 2.8 | $6 \times 10^5$ | 36 | 1.7 | 200 × 800 |
| $V_{0.95}W_{0.05}$ | 4.10 | $1 \times 10^9$ | N/A | 40 | N/A |
| a-SiGe | −2 | N/A | N/A | ~40 | N/A |
| Poly-SiGe | −1.91 | $8.3 \times 10^8$ | 15,000 | N/A | N/A |
| poly-SiGe (CVD deposited) | −2 | $2.31 \times 10^9$ | $1.4 \times 10^4$ | N/A | 25 × 25 |
| a-Si:H | 2.8-3.9 | N/A | $1 \times 10^6$ | N/A | 48 × 48 |
| a-$Ge_xSi_{1-x}O_y$ | −2.27 − −8.69 | $8.27 \times 10^6$ | $1.05 \times 10^4$ | $4.22 \times 10^2$ − $3.47 \times 10^9$ | 40 × 40 |
| Y-Ba-Cu-O | 4.02 | $1.6 \times 10^9$ | $3.8 \times 10^5$ | 32.42 | 7000 × 10000 |

In current invention, we observed that the absorption in the thin film was most sensitive in the wavelength ranges of 1.0-3.0 μm range. The optical energy band gap (0.678 eV) of the thin-film was using Tauc's equation. In addition to these, we also found the variations of absorption coefficient ($1.4802 \times 10^5$ $m^{-1}$-$1.0097 \times 10^7$ $m^{-1}$), refractive index (1.242-1.350), and the extinction coefficient (0.3255-8.010) for the wavelength ranges between 1.0-3.0 μm. We found the thin film's Resistivity to be 4.55 Ω-cm by four point probe method.

3. SUMMARY OF THE INVENTION

The present invention had been focused on to overcome the problems mentioned above to obtain high TCR and responsivity using Ge—Sn—O thin films for microbolomters by a simplified process and a method thereof and a microbolemter using the Ge—Sn—O thin films. The microbolometer encompasses a change in resistance on the sensing material due to the absorption of heat flux on it, causing a change across the sensing material's resistance to be measured across the electrodes.

The second objective of this invention is to prepare a stable Ge—Sn—O thin films for uncooled infrared detection with high reproducibility property and a method for manufacturing thereof and an infrared detector using the Ge—Sn—O thin films.

Third objective of this invention is to provide Ge—Sn—O thin films which will increase the sensitivity of microbolometer and a method of manufacturing thereof using Ge—Sn—O thin films.

Fourth objective of this invention is to prepare Ge—Sn—O thin films for bolometer's sensing layer to reduce the overall fabrication cost of the device by providing a simpler process and method of manufacturing thereof, and a microbolometer using the Ge—Sn—O thin films.

According to the invention, the thin films of $Ge_xSn_yO_z$ comprise of Ge, Sn, and O elements with values of $0.39 \leq x \leq 0.54$, $0.09 \leq y \leq 0.20$, $0.19 \leq z \leq 0.46$.

In accordance with the invention, the thin films of Ge—Sn—O are deposited by co-sputtering of Sn and Ge targets in the Ar+O environment using a radio frequency sputtering system. The films are deposited on silicon or cover glass or other conformal substrates. The thin films also deposited by the chemical vapor deposition process using various gases and precursors.

According to the invention, the thin films of $Ge_xSn_yO_z$ has a thickness ranging from 1400 nm to 1450 nm where $0.39 \leq x \leq 0.54$, $0.09 \leq y \leq 0.20$, $0.19 \leq z \leq 0.46$.

The atomic composition of the thin films of $Ge_xSn_yO_z$ where $0.39 \leq x \leq 0.54$, $0.09 \leq y \leq 0.20$, $0.19 \leq z \leq 0.46$ are controlled by changing the power of the DC sputter, power of the radio frequency sputter, process pressure, ratio of the gases' flow during the deposition and substrate temperature during the deposition.

According to the invention, there is an infrared detector comprising of bolometer. The bolometer comprises the thin films of $Ge_xSn_yO_z$ as the sensing layer which has Ge, Sn, and O elements with values of $0.39 \leq x \leq 0.54$, $0.09 \leq y \leq 0.20$, $0.19 \leq z \leq 0.46$.

As the sensing layer of microbolometer, the thin films of Ge—Sn—O has a thickness ranging from 1400 nm to 1450 nm.

As described above, in the present invention, the Ge—Sn—O film for a bolometer is prepared by a simplified process having a high TCR value and a low noise value.

Further, in the present invention, stable and high reproducibility properties are obtained.

According to the invention since the Ge—Sn—O films are manufactured using cheap equipment and a simplified method, the cost of fabricating the microbolometer device will be reduced.

The new invention will increase the sensitivity of the microbolometer devices using Ge—Sn—O films.

4. BRIEF DESCRIPTION OF FIGURES

FIG. 1: Flowchart illustrating the method for preparing the $Ge_xSn_yO_z$ thin films where $0.39 \leq x \leq 0.54$, $0.09 \leq y \leq 0.20$, $0.19 \leq z \leq 0.46$.

Figure 2:
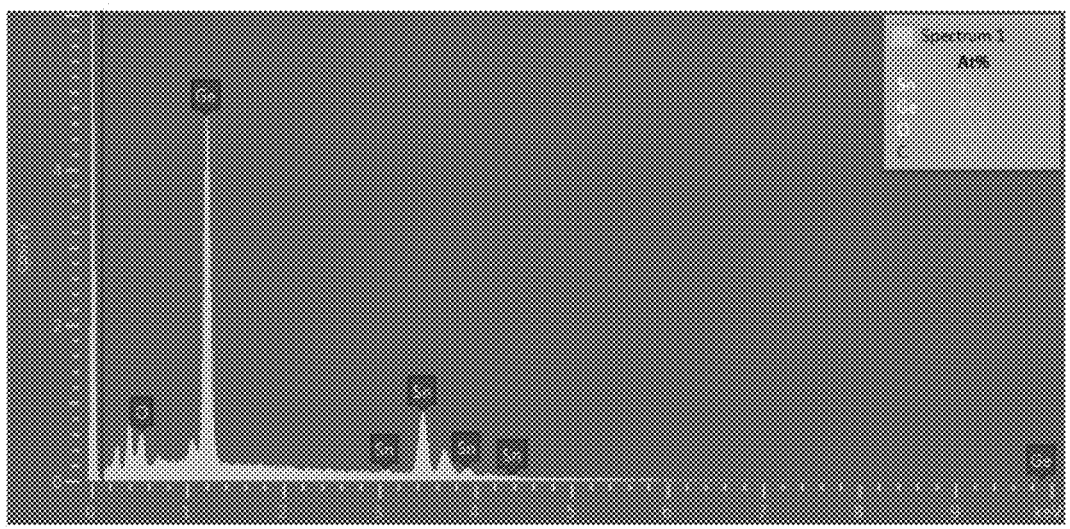

FIG. 2: Atomic Composition of Ge—Sn—O thin films determined by energy dispersive spectroscopy at 5 keV.

Figure 3:
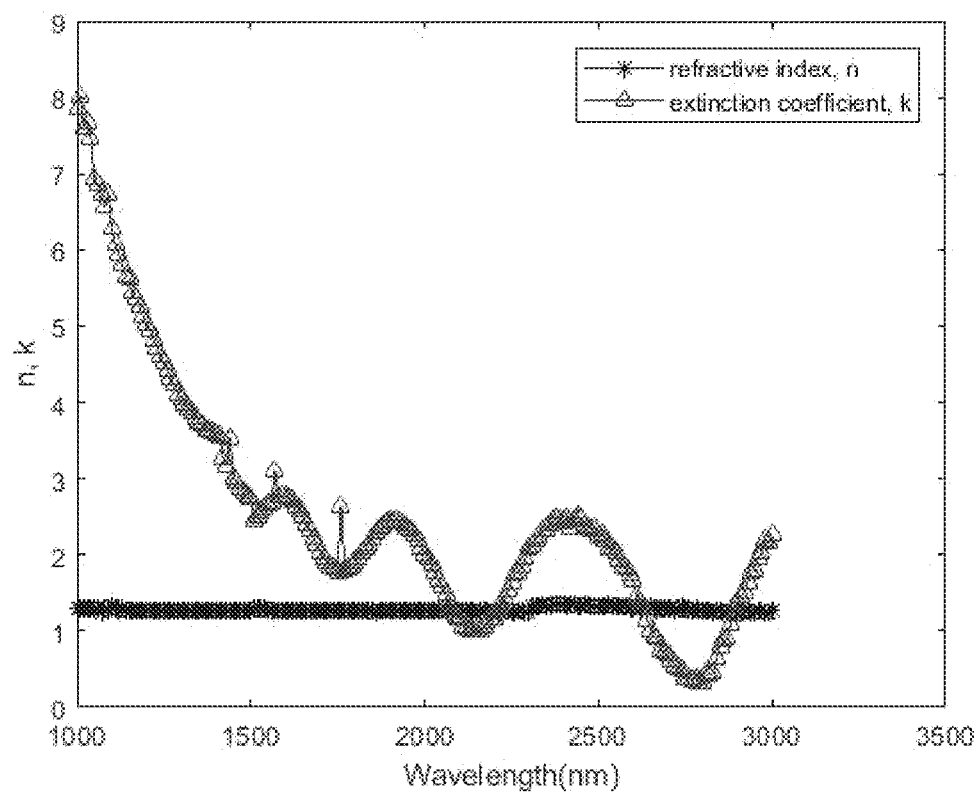

FIG. 3: Refractive index and extinction coefficient of Ge—Sn—O thin film.

Figure 4:
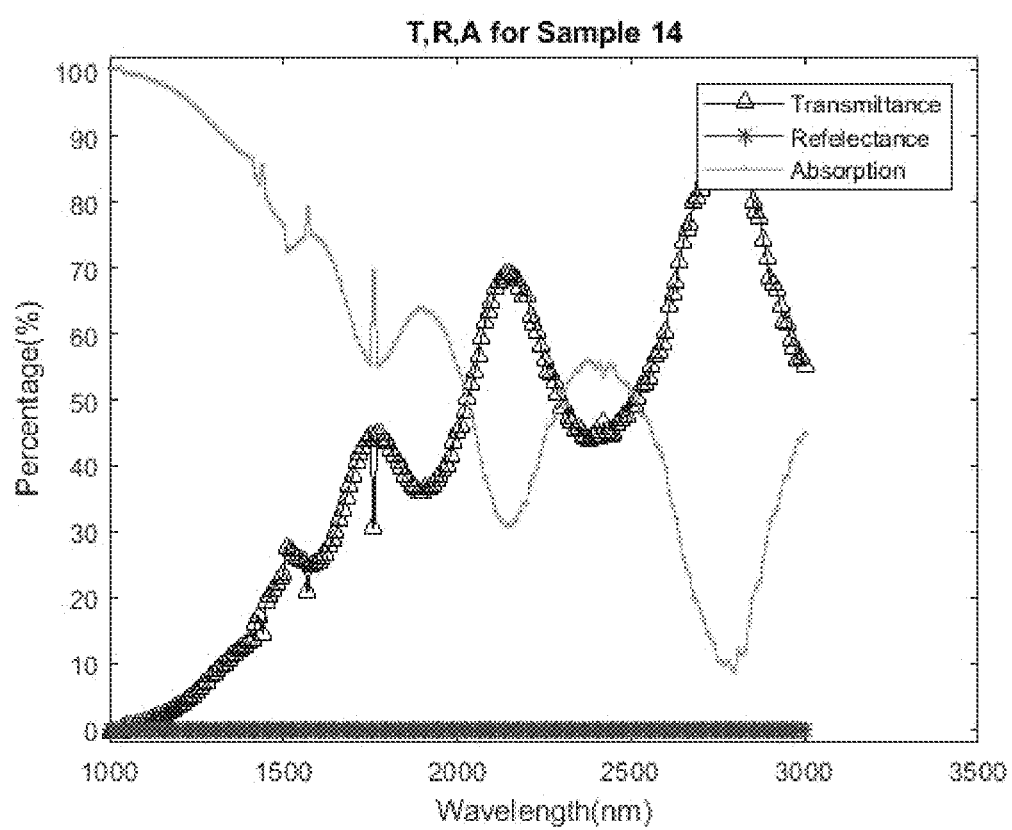

FIG. 4: Transmittance, reflectance and absorptance of Ge—Sn—O thin film.

Figure 5:
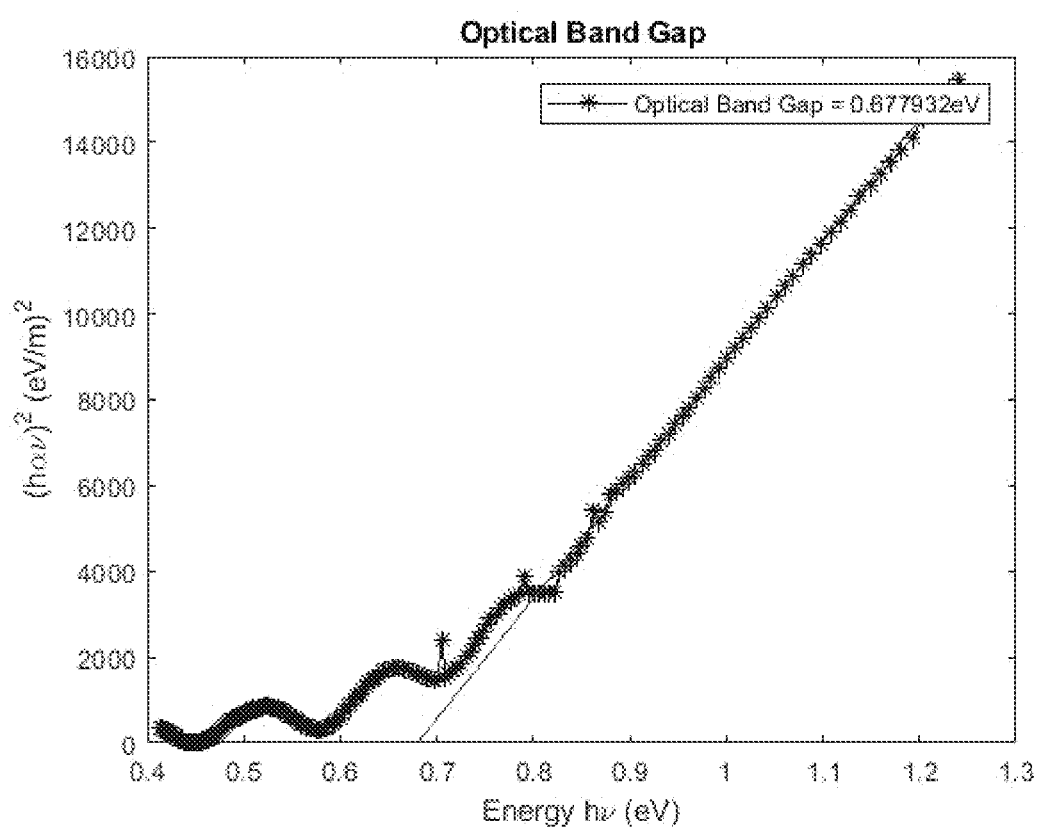

FIG. 5: Optical band gap of Ge—Si—Sn—O determined from transmittance, reflectance and absorptance data.

Figure 6:
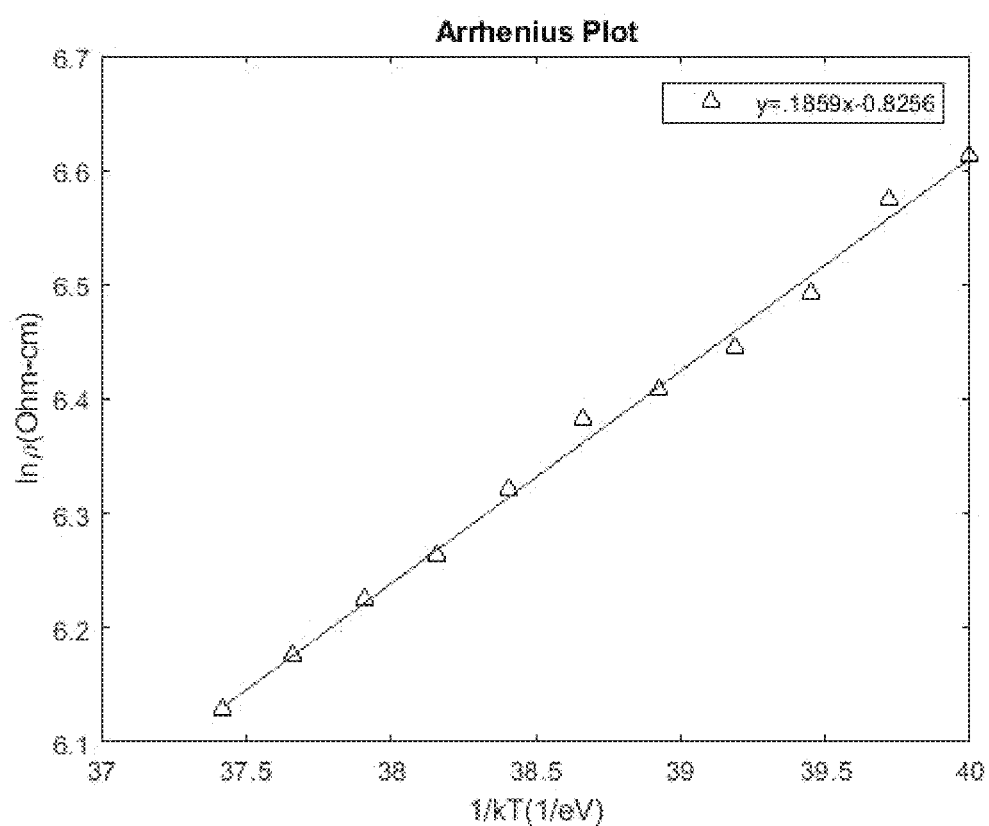

FIG. 6: Arrhenius plot at various temperature to determine the activation energy of Ge—Sn—O thin films.

Figure 7:
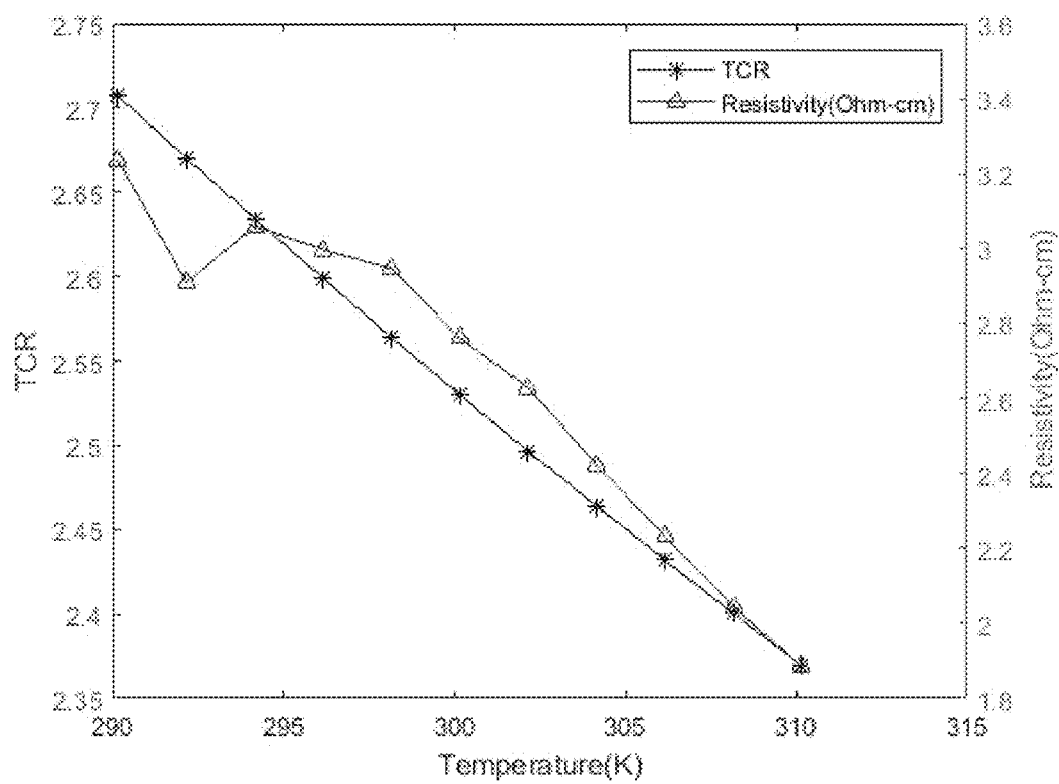

FIG. 7: Variations of resistivity and TCR with temperature.

Figure 8:
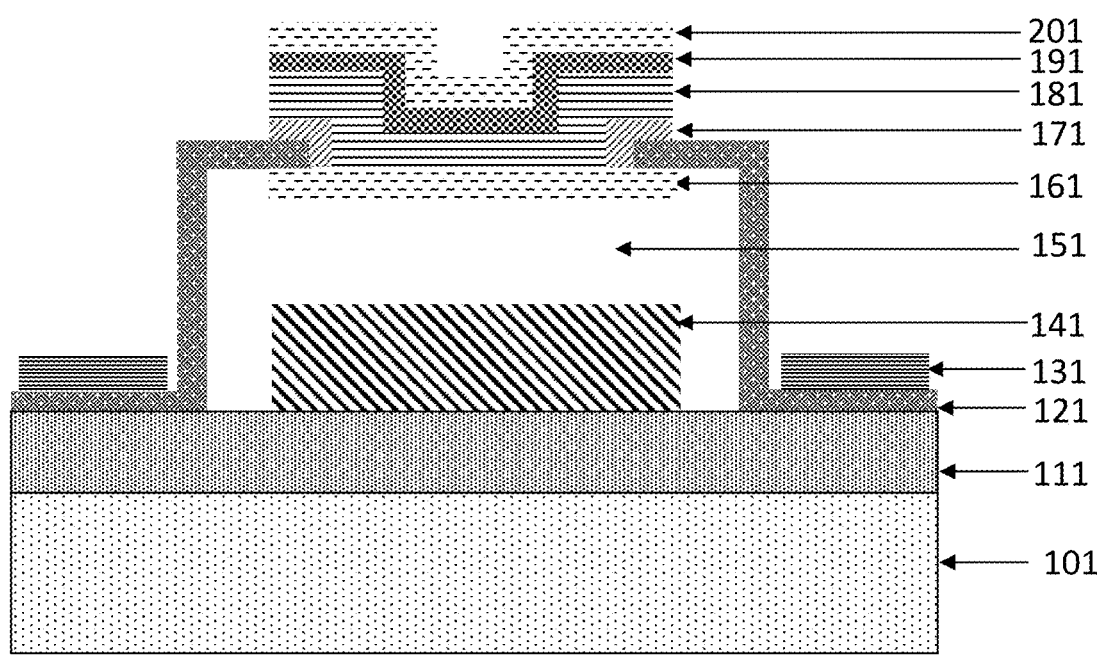

FIG. 8: Cross section of a Ge—Sn—O Microbolometer.

5. DETAILED DESCRIPTION OF EXEMPLARY EMBODIMENTS

We present here the microbolometer elements and methods for forming the same. The sensing layer of microbolometer is fabricated using various atomic compositions of Germanium, Tin, and Oxygen to form an alloy of germanium-tin-oxide (Ge—Sn—O). The variation in atomic composition in the alloy of Ge—Sn—O will allow the materials' properties to be varied. The variation of the atomic composition in Ge—Sn—O alloy will vary the fundamental material properties such as activation energy and carrier mobility. This way the key microbolometer device figures of merits such as resistivity, TCR, responsivity, absorption in IR region of interest, noise, detectivity, noise equivalent temperature difference are varied and optimized for better device performance.

Variation and optimization of atomic composition in the alloy of Ge—Sn—O allow us to increase the room temperature TCR to a value which is significantly higher than the current reported values (from −2%/k to −5%/k). TCR is one of the important properties of microbolometer and it defines the sensitivity of the microbolometer device which is defined as change in electrical resistance of the device with change in temperature. The greater the value of TCR, the better will be the sensitivity of the microbolometer device. Herein, we used oxygen to bond with other semiconductors (Ge and Sn) to increase the TCR among other properties. In the preferred embodiment we found the TCR varied between −2.25%/K to −2.56%/K for the temperature ranges 292K-312K. The resistivity for this temperature range for the thin films of Ge—Sn—O is varied between 0.5426 Ohm-cm to 45.67 Ohm-(cm). The higher resistivity of the $Ge_xSn_yO_z$ where $0.39 \leq x \leq 0.54$, $0.09 \leq y \leq 0.20$, $0.19 \leq z \leq 0.46$, alloy had been resulted from lower electrical conductivity which arises because of the low carrier mobility associated with this.

The atomic composition of the microbolometer sensing layer made of $Ge_xSn_yO_z$ thin film layer consists of two semiconducting materials (Ge, Sn) forming an alloy and bonded with oxygen where $0.39 \leq x \leq 0.54$, $0.09 \leq y \leq 0.20$, $0.19 \leq z \leq 0.46$. The element Ge, may or may not be doped with impurities such as n-type or p-type impurities while they are used as one of the constituent elements. In one embodiment, we disclose the atomic composition of $Ge_xSn_yO_z$ where the value of "x" is the atomic percentage of Ge in that alloy relative to the atomic percentage of Sn. The value of "x" varies between 0.39 to 0.54 while the value of "y" varies between 0.09 to 0.20. The value of "z" varies between 0.19 to 0.46.

In another embodiment, the thin film of $Ge_xSn_yO_z$ will be deposited using the sputtering process, where $0.39 \leq x \leq 0.54$, $0.09 \leq y \leq 0.20$, $0.19 \leq z \leq 0.46$. The sputtering process consists of radio frequency as well as direct current method.

In the present invention, the exemplary embodiments are described in details in the related art work hereinafter. The drawings presented here, will explain the current invention better although it should be noted that the present invention is not limited to the drawings.

FIG. 1 is a flow chart illustrating a method for fabricating the $Ge_xSn_yO_z$ thin film to be used as the sensing layer of the microbolometer in accordance with an embodiment of the present invention where $0.39 \leq x \leq 0.54$, $0.09 \leq y \leq 0.20$, $0.19 \leq z \leq 0.46$. FIG. 1 shows the method for manufacturing a $Ge_xSn_yO_z$ thin film for a bolometer's sensing layer where $0.40 \leq x \leq 0.90$, $0.39 \leq x \leq 0.54$, $0.09 \leq y \leq 0.20$, $0.19 \leq z \leq 0.46$. The preferred embodiment of the present invention includes is completed in a single step: this includes the deposition of $Ge_xSn_yO_z$ thin film on a substrate; In accordance with the invention, the thin films of $Ge_xSn_yO_z$ are deposited by co-sputtering of Sn and Ge targets in the Ar+O environment using a radio frequency sputtering system. The films are deposited on silicon or cover glass or other conformal substrates. The thin films are also deposited by DC sputtering or metal-organic chemical vapor deposition (MOCVD) or chemical vapor deposition process using Ge, Sn, and O based gases and precursors.

In this case, the DC sputter and the RF sputter use argon (Ar) or nitrogen ($N_2$) plasma. The thickness of the $Ge_xSn_yO_z$ thin film may ranges from 1400 nm to 1450 nm. According to the invention, the thin films of $Ge_xSn_yO_z$ comprise of Ge, Sn, and O elements with values of where $0.39 \leq x \leq 0.54$, $0.09 \leq y \leq 0.20$, $0.19 \leq z \leq 0.46$. When the z of $Ge_xSn_yO_z$ is >0.46, the electric resistance of the thin film is too large. Accordingly, it is not suitable for the bolometer applications. When the oxygen component, z, is close to zero, the electric resistance is too small and the TCR value is small as well, thereby making it not suitable for the bolometer.

A turbo pump evacuated the chamber to a base pressure of $3 \times 10^{-7}$ Torr or less before sputtering. This compound target of Ge and Tin (Sn) target both were used simultaneously to deposit the $Ge_xSn_yO_z$ thin films on silicon or glass or other substrates which may be flexible or rigid. The deposition will be done by using DC and/or RF sputter. The DC sputter and RF sputter use Argon (Ar) or nitrogen ($N_2$) plasma. The deposition process takes place in an oxygen atmosphere. The sputtering will take as long as 2 hours but in this case, the Ge and Sn targets were sputtered for 40 minutes. Ge was sputtered at 250 W while Sn was sputtered at 75 W. The preferred embodiment includes a design of material for each of the layers of the microbolometer whose composition and thickness leads to high figures of merits. Germanium Tin Oxide (Ge—Sn—O) was created by co-sputtering Ge with Sn targets in the Ar+O environment using a radio frequency sputtering system.

Radio frequency sputtering system is defined as a technique involved in alternating the electrical potential of the current in the vacuum environment at radio frequencies to avoid a charge building up on certain types of sputtering target materials, which over time will result in arching into the plasma that spews droplets creating quality control issues on the thin films and will even lead to the complete cessation of the sputtering of atoms terminating the process. In this case, Ge at 250 W and Sn at 75 W were sputtered for 40 minutes with a deposition rate of 5.997 Å per second on a silicon wafer.

After sputtering process, energy dispersive spectroscopy function from a scanning electron microscope was used to determine the atomic compositions of the thin film.

FIG. 2: shows the atomic Composition of $Ge_xSn_yO_z$ thin films determined by energy dispersive spectroscopy done at 5 keV where $0.39 \leq x \leq 0.54$, $0.09 \leq y \leq 0.20$, $0.19 \leq z \leq 0.46$. The unique peaks in FIG. 2 indicate the estimated value of abundance of the different elements in the thin film. In the preferred embodiment, $Ge_xSn_yO_z$ thin films consist of 30.2% Oxygen, 14.3% Tin, 48.3% Germanium, and 7.1% Carbon where $0.39 \leq x \leq 0.54$, $0.09 \leq y \leq 0.20$, $0.19 \leq z \leq 0.46$. As mentioned earlier, the thin films of $Ge_xSn_yO_z$ comprise of Ge, Sn, and O elements. In the preferred embodiment, the values ranges $0.39 \leq x \leq 0.54$, $0.09 \leq y \leq 0.20$, $0.19 \leq z \leq 0.46$ Determination of atomic composition of the constituent elements in the thin films of Ge—Sn—O is crucial for not only the correct elemental composition in Ge—Sn—O but also for unique behavior of $Ge_xSn_yO_z$ thin film (where $0.39 \leq x \leq 0.54$, $0.09 \leq y \leq 0.20$, $0.19 \leq z \leq 0.46$) for sensing layer of microbolometer.

FIG. 3 indicates the refractive index and extinction coefficient of the Ge—Sn—O thin film. Refractive index is a number that describes how light propagates through that medium, while the extinction coefficient indicates several different measures of the absorption of light in a medium. Extinction coefficient refers to a measure of the rate of decrease in the intensity of electromagnetic radiation (as light) as it passes through a given substance;

Extinction coefficient $k(\lambda)$ is given by:

$$k(\lambda) = \frac{a\lambda}{4\pi} \quad (6)$$

Where a is the absorption coefficient, $\lambda$ is the wavelength. Reflective index $n(\lambda)$ is the measure of the propagation of a ray of light as it passes from one medium to another and it was also derived by:

$$n(\lambda) = n_s(\lambda)\left(\frac{1+\sqrt{R}}{1-\sqrt{R}}\right)^{0.5} \quad (7)$$

Where, $n_s$ is the refractive index of the substrate (Silicon wafer in our case) and R is the Reflectance. The refractive index for Ge—Sn—O varied between 1.2 to slightly above 1.3 for the wavelength ranges between 1.0 μm to 3.0 μm. These values are different from pure Ge, Sn, or their oxides. The extinction coefficient varied between 0.32 to 8.01 for the wavelength ranges between 1.0 μm to 3.0 μm. The values of the extinction coefficient are also different from pure Ge, Sn, or their oxides. The values of extinction coefficient and refractive index at various wavelengths determines the absorption, reflection and transmission through the thin films. The absorption in the film at a particular wavelength is crucial as because of the absorption the thin films' temperature changes and we get a TCR. The values of absorption coefficient along with the reflection coefficient and transmittance at various wavelength is mentioned in FIG. 4.

FIG. 4 indicates the transmittance, reflectance and absorptance of $Ge_xSn_yO_z$ thin film, where $0.39 \leq x \leq 0.54$, $0.09 \leq y \leq 0.20$, $0.19 \leq z \leq 0.46$. These measurements were carried out using monochromator, infrared (IR) light source, pyroelectric detector, mechanical chopper, dynamic signal analyzer and computer. Infrared (IR) light signal was generated using a IR source which came out of the monochromator and was chopped at 100 Hz. Results of peak signal at 100 Hz and noises were recorded from dynamic signal analyzer in order to find the corresponding transmittance and reflectance in the thin films between the wavelength ranges 2.5-5.5 μm. Kirchhoff's law was then used to calculate the absorptance.

Transmittance $\tau(\lambda)$ through a thin film is expressed as the ratio of transmitted flux ($\phi_{\lambda,t}$) to the incident flux ($\phi_{\lambda,i}$)

$$\tau(\lambda) = \frac{\phi_{\lambda,t}}{\phi_{\lambda,i}} \quad (8)$$

where, $\lambda$ is the wavelength.

Kirchhoff's law relating to absorptance ($\alpha$), transmittance ($\tau$) and reflectance ($\rho$) is expressed as:

$$\alpha + \tau + \rho = 1 \quad (9)$$

Absorption coefficient is a measure of the rate of decrease in the intensity of electromagnetic radiation (as light) as it passes through a given substance. For application as the sensing layer of microbolometer, we need the absorption value to be as high as possible. Higher absorption in the sensing layer will heat up the material and then the resistance of the material will reduce. So the higher absorption is associated with greater sensitivity. The addition of Sn in $Ge_xSn_yO_z$ thin films, increase the absorption in the wavelength ranges between 2 to 4.5 where $0.40 \leq x \leq 0.90$, $0.08 \leq y \leq 0.60$, $0.01 \leq z \leq 0.20$.

FIG. 5 is Optical band gap of $Ge_xSn_yO_z$ determined from transmittance, reflectance and absorptance data which shown earlier. Extrapolation of $(\alpha h\nu)^{1/2}=0$ of linear portion in the plot of $(\alpha h\nu)$ versus the photon energy h$\nu$, gave the value of optical bandgap as mentioned in FIG. 5 where $0.39 \leq x \leq 0.54$, $0.09 \leq y \leq 0.20$, $0.19 \leq z \leq 0.46$. To determine the optical bandgap, we used Tauc's equation for direct bandgap semiconductor which is expressed below:

$$\alpha h\nu = B(h\nu - E_g)^{1/2} \quad (10)$$

Where B is a constant, h$\nu$ is the photon energy and $E_g$ is the energy band gap. $(\alpha h\nu)^2$ was graphed as a function of h$\nu$ and the energy band gap was determined at the h$\nu$ value where $\alpha=0$. Optical bandgap is an important parameter for optical detectors such as microbolometers. The optical bandgap of Ge—Sn—O in this case is 0.678 eV which is unique for the $Ge_{0.483}Sn_{0.143}O_{0.302}$ thin film. The optical bandgap plays an important role in optoelectronic properties of the material. When the photon falls on top of the material, if its energy is higher than the optical bandgap then it creates and electron hole pair. This is the principle of operation for a photon detector. For thermal detectors like microbolometers, the detector material's temperature rises and the resistivity fo the material changes. Hence, electrical bandgap is an inherent property of the material—Ge—Sn—O.

FIG. 6 illustrates Arrhenius plot at various temperature to determine the activation energy of $Ge_xSn_yO_z$ thin films where $0.39 \leq x \leq 0.54$, $0.09 \leq y \leq 0.20$, $0.19 \leq z \leq 0.46$. Activation energy is the minimum energy required to cause a process (such as a chemical reaction) to occur. It is expressed using Arrhenius formula as follows;

$$k = -\frac{E_a}{R}\left(\frac{1}{T}\right) + \ln A \quad (11)$$

where, k represents the rate constant, $E_a$ is the activation energy, R is the gas constant (8.3145 J/K mol), and T is the temperature expressed in Kelvin. A is known as the frequency factor, having units of L mol$^{-1}$ s$^{-1}$, and takes into account the frequency of reactions and likelihood of correct molecular orientation.

Four point probe instrument was used to measure average resistance of the film by passing current through the outside two points of the probe and measuring the voltage across the inside two points. This resistance is called sheet resistance ($R_s$).

If the spacing between the probe points is constant, and the conducting film thickness is less than 40% of the spacing, and the edges of the film are more than 4 times the spacing distance from the measurement point, the average resistance of the film or the sheet resistance is given by;

$$Rs = 4.53 \times V/I \quad (11)$$

Total resistance R is given by;

$$R = R_s * t \quad (12)$$

Where, $R_s$ is the measured sheet resistance and t is the films thickness. From FIG. 6 it is seen that the plot of natural logarithm of resistivity ($\rho$) versus 1/kT is a straight line and the slope of the straight line provides the value of the activation energy associated with this process. The higher the activation energy, higher will be the TCR associated with it. Adding oxygen with the Ge—Sn compound increases the activation energy (Ea). The activation energy for $Ge_{0.483}Sn_{0.143}O_{0.302}$ thin film is 0.1859 eV.

In FIG. 7, we show the variations of temperature coefficient of resistance, TCR and resistivity for a resistor is determined by measuring the resistances values over an appropriate temperature range in Kelvin. The TCR is calculated as the average slope of the resistance value over this interval. TCR exhibits how rapidly the resistance of the sensing material responds to a change in temperature and is expressed as;

$$\alpha = \frac{1}{R} \cdot \frac{dR}{dT} = \frac{1}{R} \frac{\Delta R}{\Delta T} = -\frac{E_a}{kT^2} \quad (13)$$

Here, $E_a$ is the activation energy and k is the Boltzmann constant.

TCR is a material property, so the higher the value, the better it is for IR uncooled detection. The room temperature (301K) TCR value is 2.53%/K which is at on par with the Vanadium Oxide that is used as one of the most popular materials for microbolometers. The resistivity of the for $Ge_{0.483}Sn_{0.143}O_{0.302}$ thin film varied between 3.24 Ohm-cm to 1.88 Ohm-cm for the temperature range between 290 K to 325 K FIG. 8 shows the cross sectional view of the microbolometer using Ge—Sn—O sensing layer. The substrate 101 in this case is Silicon. The depositions of different layers other than the Al and polyimide were done by a RF magnetron sputtering system equipped with a turbo pump and a three-inch target holder. Prior to sputtering, the process chamber was evacuated to $3 \times 10^{-7}$ Torr by the turbo pump. Sputtering was done at 3 mTorr pressure. An Ar flow of 54 SCCM was used in every sputtering process other than deposition. In fabricating the $Ge_xSn_yO_z$ bolometer, lift off technique was used for patterning all the films because of its simplicity where $39 \leq x \leq 54$, $09 \leq y \leq 20$, $19 \leq z \leq 46$.

The fabrication of the bolometer starts by depositing 400 nm of silicon nitride 111 on a cleaned lightly doped p-type, three inch diameter silicon wafer 101. This layer of silicon nitride 111 serves as the electrical insulation for the substrate and would withstand all the solvents used in next fabrication steps. Then a 400-nm-thick layer of Al layer 141 was deposited by thermal evaporation and patterned. The cryo pump of the evaporator was cooled down to 20 K after which the sample was mounted. The chamber was evacuated to $1 \times 10^{-6}$ Torr prior to evaporation. A deposition rate of 5 angstrom/sec was achieved at 100 Ampere of applied current. To perform the lift off, negative resist NR7-1500P from Futurrex Corporation was spin coated on the wafer at 3000 rpm for 30 seconds. Then the wafer was pre baked at 150° C. for 60 seconds on a hot plate and exposed under the ultraviolet light. A post exposure bake for 60 seconds was done at 120° C. on a hot plate. Then the resist was developed in RD6, a negative resist developer from Futurrex Corporation, for 50 seconds. The resist thickness was found to be about 1.8 µm after developing. This was found to be thick enough to lift off 0.4-µm-thick Al layer 141. After depositing Al film, the wafer was kept in 1165 photo resist striper for about two hours to complete the lift off process. The wafer was then rinsed with acetone, methanol, and DI water followed by a blow dry in nitrogen to make it clean. This Al layer 141 would serve as a mirror for reflecting the infrared rays and form the basis of an optically resonant cavity.

A sacrificial layer 151 of photo definable polyimide PI-2737 from HD Microsystems was spin coated, patterned by conventional photolithography and wet etching process. The polyimide was cured in the convection oven. After curing the polyimide thickness was found 2.2 For patterning, the polyimide was spin coated at a speed of 1650 rpm for 60 seconds. Then it was baked on two step hot plate. In first step, it was baked at 70° C., while in second step it was baked at 100° C., both for three minutes. Then it was exposed in ultraviolet light. For developing polyimide, developer DE 9040 along with rinse solution RI 9180, both from HD Microsystem, were used. To store these solutions and complete developing process, four tanks and one squeeze bottle were used. First two of the four tanks were filled with 100% DE 9040 solution, third tank was filled with 50% DE 9040 and 50% RI 9180 solutions, fourth tank was filled with 25% DE 9040 and 75% RI 9180 solutions, while the squeeze bottle was filled with 100% RI 9180 solution. The wafer was kept inside the first two tanks for 10 seconds and agitated ultrasonically. Then it was transferred to the second and third tank respectively where it was kept for 15 seconds in each of them. Then the wafer was rinsed with RI 9180 solution for 20 seconds, by holding it vertically to remove all the polyimide flakes. By using four tanks instead of one tank, the problem of flakes generation was solved. The polyimide thickness at that point was about 5.3 µm. This was then cured in an oven at 250° C. for four hours in nitrogen ambient. The temperature was ramped slowly (from room temperature to 250° C. in one and half hours) to avoid possible thermal stress in the film.

To achieve low thermal mass, the sensing layer of $Ge_xSn_yO_z$ 181 was made 0.6579 µm-thick. In order to make the sensing layer mechanically strong as well as free of warping, a sandwich structure of $Ge_xSi_ySn_{1-(x+y)}O_z$ was made employing silicon nitride where, $39 \leq x \leq 54$, $09 \leq y \leq 20$, $19 \leq z \leq 46$. The sandwich layers increase the thermal mass of the detector. However, they were found to be necessary, since the first type of the bolometers were fabricated without silicon nitride sandwich layers and they were found to be warped after removing the sacrificial polyimide. To achieve the sandwich structure, first the bottom silicon nitride layer 161 was deposited and patterned. The thickness of this layer was set to 100 nm. Silicon nitride was chosen for this case, because silicon nitride is known to passivate silicon dioxide, although in current work it was not observed any significant effect of passivating the $Ge_xSi_ySn_{1-(x+y)}O_z$ sensing layer 181 with silicon nitride where $39 \leq x \leq 54$, $09 \leq y \leq 20$, $19 \leq z \leq 46$. Next, a 200-nm-thick NiCr (20% Ni, 80% Cr) electrode arm 121 was deposited and patterned. NiCr has very low thermal conductivity, and thus provides good thermal isolation between bolometer thermometer and substrate.

To form an Ohmic contact with p-type $Ge_xSn_yO_z$, a 50-nm-thick Ni film 171 was deposited on top of NiCr arm and patterned where $39 \leq x \leq 54$, $09 \leq y \leq 20$, $19 \leq z \leq 46$. Then, the sensing layer of $Ge_xSn_yO_z$ was deposited in an $Ar:O_2$ environment from a compound target of Ge and Sn where $39 \leq x \leq 54$, $09 \leq y \leq 20$, $19 \leq z \leq 46$. Next, a 14-nm-thick NiCr absorber 191 and 100-nm-thick silicon nitride 201 layers were deposited. This silicon nitride layer 201 works as the top layer of the sandwich structure. These three layers were lifted of together. Finally, a 300-nm-thick Ni bond-pad-layer 131 was deposited on top of NiCr for the simplicity of bonding the device ultrasonically. At this point, the bolometer fabrication was completed. The sacrificial layer of polyimide under the bolometer was not removed for the sake of simplicity in device fabrication.

We claim:

1. A method of forming a thin film comprising: $Ge_xSn_yO_z$ where, $39 \leq x \leq 54$, $09 \leq y \leq 20$, $19 \leq z \leq 46$.

2. The method of claim 1, wherein the thin film is deposited by one of radio frequency sputtering, direct current sputtering, chemical vapor deposition, metal organic chemical vapor deposition techniques.

3. The method of claim 1, wherein the thin film of $Ge_xSn_yO_z$ where x, y, z values, $39 \leq x \leq 54$, $09 \leq y \leq 20$, $19 \leq z \leq 46$ is deposited in Ar:O environment by radio frequency and direct current sputtering method.

4. The method of claim 1, wherein the transmittance, reflectance and absorptance of the thin film varies between 0% to 90%, 0% to 75% and 0% to 100% respectively for the wavelength ranges 1.0 µm to 3.0 µm.

5. A thin film comprising: germanium tin oxide with a chemical formula $Ge_xSn_yO_z$ with x, y, z values $39 \leq x \leq 54$, $09 \leq y \leq 20$, $19 \leq z \leq 46$.

6. The thin film of claim 5, whose refraction index varies between 1.2 to 14 and extinction coefficient varies between 0.32 to 8.01 for the wavelength ranges from 1.0 µm to 3.0 µm.

7. The thin film of claim 5, whose transmittance, reflectance and absorptance varies between 0% to 90%, 0% to 75% and 0% to 100% respectively for the wavelength ranges 1.0 µm to 3.0 µm.

8. The thin film of claim 5, wherein the optical bandgap of the thin film varies between 0.51 eV to 0.93 eV.

9. The thin film of claim 5, wherein the activation energy of the thin film has a value between 0.007 eV to 0.196 eV depending on the atomic composition of the thin film.

10. The thin film of claim 5, wherein the resistivity of the thin film varies between 3.24 Ohm-cm to 1.88 Ohm-cm between the temperature ranges 292K-312K.

11. The thin film of claim 5, wherein coefficient of Resistance (TCR) varies in the range—2.56%/K--2.25%/K between the temperatures ranges 292K-312K.

12. A method of forming a microbolometer comprising: a thin film comprising $Ge_xSn_yO_z$ where x, y, z values, $39 \leq x \leq 54$, $09 \leq y \leq 20$, $19 \leq z \leq 46$.

13. The method of claim 12, the thin film is deposited by one of radio frequency sputtering, direct current sputtering, chemical vapor deposition, metal organic chemical vapor deposition techniques.

14. The method of claim 12, wherein the thin film of $Ge_xSn_yO_z$ deposited in Ar:O environment by radio frequency sputtering method.

15. The method of claim 12, wherein the thin film has a refraction index varies between 1.2 to 1.4 and extinction coefficient varies between 0.32 to 8.01 for the wavelength ranges 1.0 µm to 3.0 µm.

16. The method of claim 12, wherein the optical bandgap of the thin film varies between 0.51 eV to 0.93 eV.

17. The method of claim 12, wherein the activation energy of the thin film has a value between 0.007 eV to 0.196 eV depending on the atomic composition of the thin films.

18. The method of claim 12, wherein the resistivity of the thin film varies between 3.24 Ohm-cm to 1.88 Ohm-cm between the temperature ranges 292K-312K.

19. The method of claim 12, wherein the temperature coefficient of Resistance (TCR) of the thin film varies in the range −2.56%/K--2.25%/K between the temperatures ranges 292K-312K.

* * * * *

UNITED STATES PATENT AND TRADEMARK OFFICE
CERTIFICATE OF CORRECTION

PATENT NO. : 10,337,927 B1
APPLICATION NO. : 16/127589
DATED : July 2, 2019
INVENTOR(S) : Mukti Rana and Jaime Damiany Cardona It is certified that error appears in the above-identified patent and that said Letters Patent is hereby corrected as shown below:

In the Specification

At Column 1, Line 3, please insert:
--This invention was made with government support under the following grant numbers: 725163-RT-REP awarded by the Army Research Office; N00014-16-1-2727 and N000141512812 awarded by the Office of Naval Research; NNX15AP84A awarded by NASA MIRO; and 1242067 awarded by the National Science Foundation. The government has certain rights in the invention.--

Signed and Sealed this
Fifth Day of March, 2024

Katherine Kelly Vidal
*Director of the United States Patent and Trademark Office*